(12) United States Patent
Fuller, Jr. et al.

(10) Patent No.: US 7,071,423 B2
(45) Date of Patent: *Jul. 4, 2006

(54) CIRCUITIZED SUBSTRATE ASSEMBLY AND METHOD OF MAKING SAME

(75) Inventors: James W. Fuller, Jr., Endicott, NY (US); John M. Lauffer, Waverly, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 90 days.

This patent is subject to a terminal disclaimer.

(21) Appl. No.: 10/915,483

(22) Filed: Aug. 11, 2004

(65) Prior Publication Data

US 2005/0011670 A1    Jan. 20, 2005

Related U.S. Application Data

(62) Division of application No. 10/322,527, filed on Dec. 19, 2002, now Pat. No. 6,809,269.

(51) Int. Cl.
*H05K 1/00* (2006.01)
*H01R 12/04* (2006.01)

(52) U.S. Cl. ...................... 174/262; 174/255

(58) Field of Classification Search ............... 174/255, 174/262, 261, 250, 264; 361/792, 793, 794, 361/795

See application file for complete search history.

(56) References Cited

U.S. PATENT DOCUMENTS

| | | | |
|---|---|---|---|
| 4,612,083 A | | 9/1986 | Yasumoto et al. |
| 5,129,142 A | * | 7/1992 | Bindra et al. .................. 29/852 |
| 5,902,118 A | | 5/1999 | Hubner |
| 5,956,843 A | | 9/1999 | Mizumoto et al. |
| 5,995,379 A | * | 11/1999 | Kyougoku et al. .......... 361/806 |
| 6,320,140 B1 | * | 11/2001 | Enomoto ..................... 174/264 |
| 6,388,204 B1 | | 5/2002 | Lauffer et al. |
| 6,459,047 B1 | | 10/2002 | Japp et al. |
| 6,479,093 B1 | | 11/2002 | Lauffer et al. |
| 6,900,392 B1 | * | 5/2005 | Fuller et al. ................. 174/255 |
| 2002/0157864 A1 | * | 10/2002 | Koyama et al. ............. 174/261 |

OTHER PUBLICATIONS

IBM TDB, "Automatic Method For Registration And Stacking of Laminates", by Hollis.
IBM TDB, "Multilayer Subsurface Circuit Board Constructions", by Mace.

* cited by examiner

*Primary Examiner*—Ishwar (I. B.) Patel
(74) *Attorney, Agent, or Firm*—Hinman, Howard & Kattell, LLP; Lawrence R. Fraley

(57) ABSTRACT

A circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith.

9 Claims, 4 Drawing Sheets

CIRCUITIZED SUBSTRATE ASSEMBLY AND METHOD OF MAKING SAME

CROSS REFERENCE TO APPLICATION

This application is a divisional application of Ser. No. 10/322,527, entitled "Circuitized Substrate Assembly And Method Of Making Same", filed Dec. 19, 2002 now U.S. Pat. No. 6,809,269 (Inventors: J. Fuller et al).

TECHNICAL FIELD

The present invention relates to circuitized substrates, and more particularly to composite circuitized structures such as printed circuit boards (PCBs). The present invention also relates to a method for fabricating such structures.

BACKGROUND OF THE INVENTION

One method of forming a laminate circuitized board structure includes forming layers of dielectric material and electrically conducting material to provide multiple layers of circuits and voltage planes. Circuits can be discrete wiring patterns known as signal planes. Voltage planes can be either ground plane or power planes, and are sometimes collectively referred to as power planes. In one technique of forming such structures, layers of dielectric material and conductive material are successively applied, i.e., the dielectric material is applied and then circuits or voltage planes are provided thereon and, if necessary, through holes formed by drilling or etching. This method relies on each successive step of adding additional structure and the circuitry layers are formed individually, e.g., in each step in forming the plane having circuit traces or formed power planes. This requires precision drilling to form the plated through holes (PTHs) all of which is time consuming, especially where there is a large number of drilled holes required to form PTHs.

More recently, methods have been described that provide a relatively inexpensive photolithographic technique of forming a composite laminate structure (substrate assembly) from individual discrete laminate structures (substrates). For example, see U.S. application Ser. No. 09/812,261, entitled "Printed Wiring Board Structure With Z-Axis Interconnections" and filed Mar. 19, 2001. See also U.S. Pat. No. 6,388,204 (Lauffer et al) and U.S. Pat. No. 6,479,093 (Lauffer et al), the teachings of which are incorporated herein by reference. Although the structures and methods of these inventions provide significant advances and advantages over current PCB fabrication methods, there still exists a need for further refinement. Therefore, continuing efforts are underway in attempting to provide for even greater advantages. The present invention is a result of such efforts.

It is believed that such an invention will constitute a significant advancement in the art.

OBJECTS AND SUMMARY OF THE INVENTION

It is a primary object of the present invention to enhance the circuitized substrate assembly art.

It is another object of the invention to provide a circuitized substrate assembly which provides for high density wiring patterns and which can be manufactured in an efficient, facile manner.

It is still another object of the invention to provide a method of making the aforementioned circuitized substrate assembly.

According to one aspect of the invention, there is provided a circuitized substrate assembly comprising a first circuitized substrate including an opening therein, a second circuitized substrate bonded to the first circuitized substrate and including an opening therein substantially aligned with the opening in the first circuitized substrate, and a quantity of electrically conductive paste substantially completely filling the opening in the second, bonded circuitized substrate and only partly filling the opening in the first circuitized substrate.

According to another aspect of the invention, there is provided a circuitized substrate assembly comprising a first circuitized substrate including an opening therein, a second circuitized substrate bonded to the first circuitized substrate and including an opening therein aligned with the opening in the first circuitized substrate, an electrically conductive cover member substantially covering the opening in the second circuitized substrate on the surface of the second circuitized substrate facing the first circuitized substrate, and a quantity of electrically conductive paste positioned on the cover member and only partly filling the opening in the first circuitized substrate.

According to yet another aspect of the invention, there is provided a method of making a circuitized substrate assembly comprising providing a first circuitized substrate including an opening therein, providing a second circuitized substrate including an opening therein, substantially filling the opening in the second circuitized substrate with a quantity of electrically conductive paste, aligning the first and second circuitized substrates such that the opening in the second circuitized substrate having the electrically conductive paste therein aligns with the opening in the first circuitized substrate, and bonding the first and second circuitized substrates together such that the electrically conductive paste only partly fills the opening in the first circuitized substrate while also substantially filling the opening in the second circuitized substrate.

According to still another aspect of the invention, there is provided a method of making a circuitized substrate assembly comprising providing a first circuitized substrate having an opening therein, providing a second circuitized substrate having an opening therein, positioning an electrically conductive cover member on a surface of the second circuitized substrate facing the first circuitized substrate to substantially cover the opening in the second circuitized substrate, positioning a quantity of electrically conductive paste on the cover member, aligning the first and second circuitized substrates such that the openings in the circuitized substrates are substantially aligned, and bonding the first and second circuitized substrates such that the quantity of electrically conductive paste only partly fills the opening in the first circuitized substrate.

BRIEF DESCRIPTIONS OF THE DRAWINGS

BEST MODE FOR CARRYING OUT THE INVENTION

Figure 1:
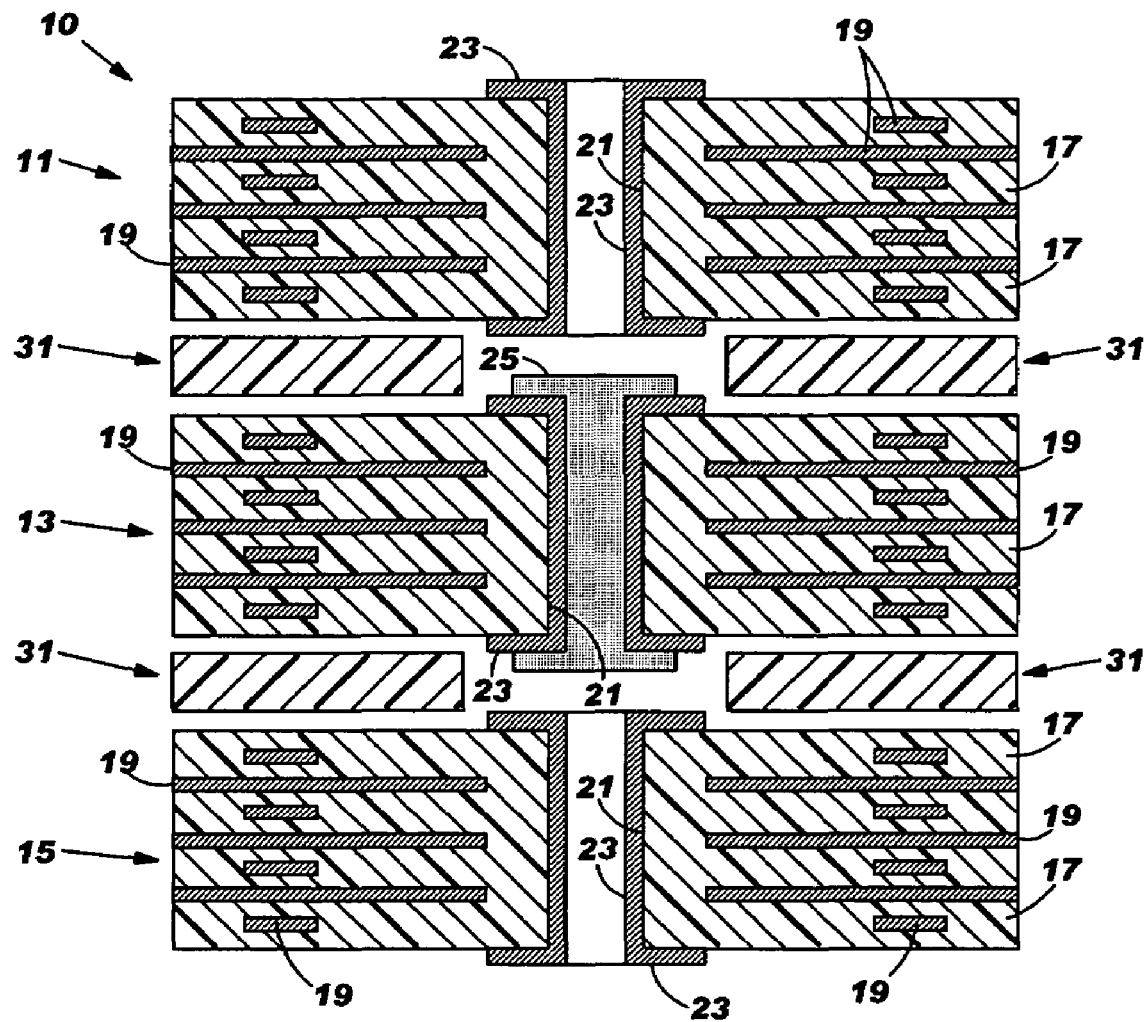
FIG. 1 is a side-elevational view of a circuitized substrate assembly prior to bonding thereof, according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

The following terms will be used herein and are understood to have the meanings associated therewith. By the term "circuitized substrate" is meant to include substrates including at least one dielectric layer and one conductive layer therein or thereon. Examples include printed circuit boards or like structures made of dielectric materials such as fiberglass-reinforced epoxy resins, polytetrafluoroethylene (Teflon), polyimides, polyamides, cyanate resins, photoimageable materials, ceramic and other like materials wherein the conductive layer is a metal layer (e.g., power or signal plane) comprised typically of copper but may include or comprise additional metals (e.g., nickel, aluminum, etc.) or alloys thereof. If the dielectric is a photoimageable material, it is photoimaged or photopatterned, and developed to reveal the desired circuit pattern, including the desired opening(s) as defined herein, if required. The dielectric material may be curtain coated or screen applied, or it may be supplied as the dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick. By the term "circuitized substrate assembly" as used herein is meant to include at least two of such circuitized substrates in a bonded configuration, one example of bonding being conventional lamination procedures known in the art. By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. dupont deNemours under the trade designation CB-100, Ablebond 8175 from the Ablestick Company and filled polymeric systems, thermoset or thermoplastic type, containing transient liquid conductive particles or other metal particles such as gold, tin, palladium, copper, alloys, and combinations thereof. One particular example is coated copper paste. Metal coated polymeric particles disposed in a polymeric matrix can also be used. By the term "sticker sheet" as used herein is meant to include dielectric materials such as conventional pre-preg materials used in conventional, multilayered PCB construction, e.g., usually by lamination. Other examples include the products Pyrolux and liquid crystal polymer (LCP) or other freestanding films. These dielectric sticker sheets may be adhesively applied to one or both of the two circuitized substrates to assist in bonding these two components. These sheets may also be patterned, e.g., by laser or photoimaging, if desired. Significantly, such sheets can also include a conductive plane (including signal, ground and/or power) therein to further increase the circuit density of the finished, bonded product taught herein. Such sticker sheets may be typically 5 to 8 mils (thousandths) thick.

In FIG. 1 there is shown a circuitized substrate assembly 10 according to one aspect of the invention. Assembly 10 includes first and second circuitized substrates 11 and 13, and may further include additional circuitized substrates such as substrate 15. In one example, a total of from two to twenty circuitized substrates may be utilized to form a final circuitized substrate assembly in accordance with the teachings of this invention. First substrate 11 includes a plurality of layers of dielectric material 17 as described above with alternating layers of conductive material 19 therein. As stated, such conductive layers may include signal, ground or power planes of the type typically found in many PCB constructions. Such conductive layers 19 are also patterned in accordance with the operational requirements for the finished assembly. The cross-sectional configurations depicted in these drawings are thus representative only and not meant to restrict the scope of the present invention. In one example of the invention, a total of eight dielectric layers and seven conductive layers may be utilized to form each substrate 11. The seven conductive layers of this example may include four signal layers and three power planes.

First substrate 11 includes an opening 21 therein. Opening 21 extends through the entire thickness of the first substrate 11. In FIG. 1, opening 21 further includes a conductive (e.g., copper) plating 23 which extends along the internal walls of opening 21 and outwardly onto the external opposing surfaces of substrate 11. These external portions of layer 23 may be referred to as lands, pads or the like for eventual electrical connection to another conductive member (in the case of substrate 13, to other lands). Opening 21 preferably includes a diameter of from about 1 to about 15 mils. The remaining openings described herein also each preferably include a similar diameter.

Second substrate 13 is similar to first substrate 11, including having dielectric layers 17 and conductive layers 19 as part thereof. Second substrate 13 also includes an opening 21 similar to that in substrate 11. Further, substrate 13 includes a conductive layer 23 similar also to that of layer 23 in FIG. 1. Layer 23 may also include the external lands (or pads) of the type shown for substrate 11. In one example, both conductive layers 23, and the external lands may possess a thickness of from about 0.5 mils to about 3.0 mils.

Significantly, opening 21 in second substrate 13 further includes a quantity of electrically conductive paste 25 therein. As see in FIG. 1, paste 25, of the type defined in detail above, completely fills opening 21 in the second substrate. Additionally, the electrically conductive paste 25 may also extend outwardly onto the external surfaces of the lands of layer 23 as also shown in FIG. 1. In one example, a total of 400 cubic mils of paste may be applied to each external land on both surfaces of the substrate. Paste application can be performed by conventional techniques such as stencil printing, screen printing or injection. Further description is thus not believed necessary.

In the broadest embodiment of the invention, only two circuitized substrates may be utilized to perform a final, bonded assembly 10. As shown in FIG. 1, however, the utilization of a third circuitized substrate 15 will also be described but is not meant to limit the scope of the claimed invention. Substrate 15 is thus substantially similar in components as substrates 11 and 13. It is also to be noted that although the patterns of dielectric and conductive layers within the various substrates shown are similar, the invention is not limited to these configurations. Several different patterns of layers can be utilized for the various substrates.

Figure 2:
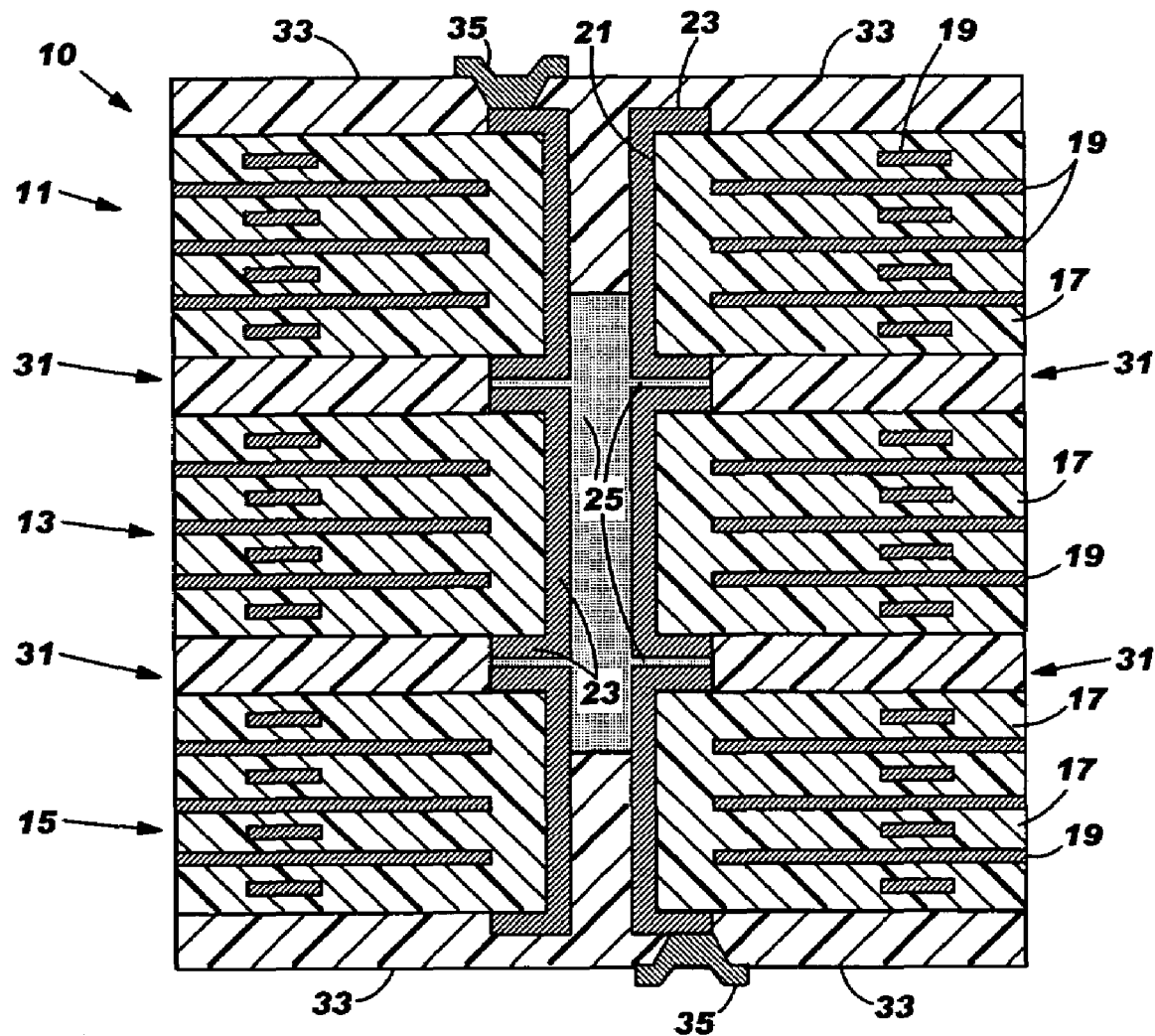
FIG. 2 is a side-elevational view of the assembly of FIG. 1 following bonding.

With the substrates aligned in the orientation shown in FIG. 1, the next step is to bond the substrates to form assembly 10. Such a bonded assembly 10 is shown in FIG. 2. The preferred method of accomplishing such bonding is to use a conventional laminating process, which, in one example, is carried out at temperatures from about 70 to about 200 degrees Celsius (C.) for a time period of about 30 to about 180 minutes and under a laminating pressure of from about 50 to about 500 pounds per square inch (p.s.i.).

In a preferred embodiment, a sticker sheet 31 is positioned between the respective substrates prior to lamination for the purpose of improving the bond between the substrates. The preferred sticker sheet material is defined hereinabove. It is understood, according to the broad aspects of the invention, that use of such a sticker sheet is not essential to achieve a satisfactory bond between the circuitized substrates taught herein. As clearly seen in FIG. 1, the dielectric sticker sheet 31 does not physically engage conductive paste 25 prior to the bonding of the substrates. It cannot, therefore, provide support for the paste during the bonding steps.

In FIG. 2, the bonded circuitized substrate assembly 10 is fully compressed as a result of the aforedefined lamination process. Significantly, the conductive paste 25 has extended from its original position both upwardly and downwardly to partially fill the respective opposing openings 21 in substrates 11 and 15. Of further significance, paste 25 also extends between the opposing faces of the respective lands of layers 23 formed on the external surfaces of the respective substrates. Thus, an effective electrical connection has been attained between the conductive layers 23 of all three substrates using but a singular quantity of conductive paste 25. Such interim placement of conductive paste 25 between the lands further enhances the electrical connection between the respective substrates in the manner taught herein.

Additional operations may now be performed on the bonded assembly 10, including the addition of another dielectric layer 33 and a conductive land 35 or the like which extends downwardly to contact the exposed land portion of a respective land portion of layer 23. Layer 33 may serve as a mounting layer or the like for additional electrical components (not shown) which may be positioned thereon.

Figure 3:
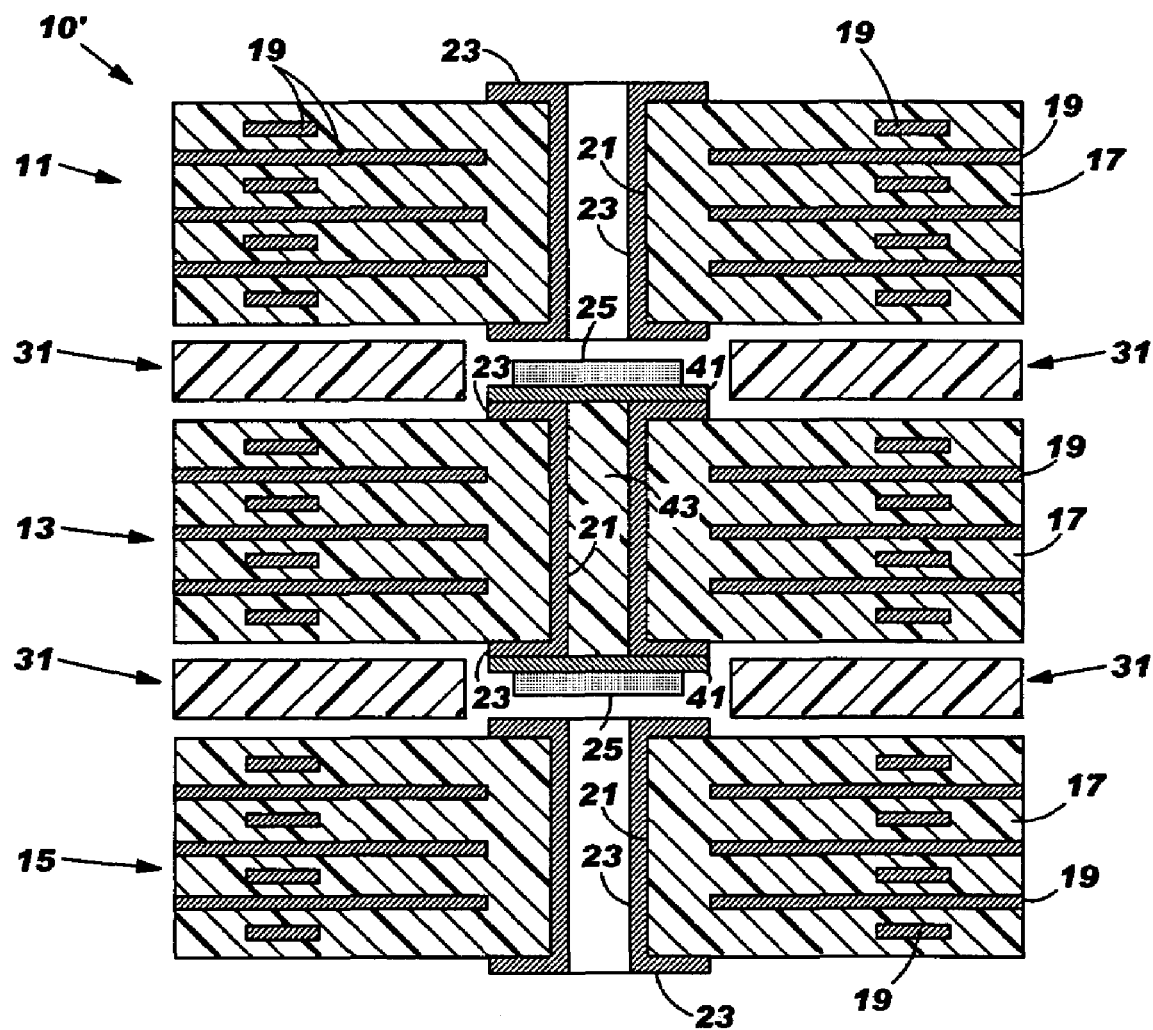
FIG. 3 is a side-elevational view of a circuitized substrate assembly prior to bonding thereof, according to another embodiment of the invention.

In FIG. 3 there is shown a bonded circuitized substrate assembly 10' according to an alternative embodiment of the invention. Assembly 10' includes the same components as shown in the embodiment of FIG. 1 with the exception that conductive paste is not filled within the opening 21 of substrate 13. Instead, a cover member 41 is provided over the external land portions of layer 23 of substrate 13. A preferred cover member is a metallic layer, e.g., copper. Prior to positioning of cover member 41, the opening in substrate 13 is preferably filled with a dielectric or other material (including conductive) 43. In a preferred embodiment, material 43 is a dielectric material of the type described above. With such dielectric material in place, cover members 41 may be plated over the external exposed surfaces of the positioned dielectric 43. In on example, cover layer 41 may include a thickness of from about 0.1 mils to about 2.0 mils.

As further seen in FIG. 3, a quantity of conductive paste 25 is positioned over the cover member 41 and is comprised of a similar paste as used in the embodiment of FIG. 1. In one example, a quantity of 400 cubic mils of paste 25 is applied onto cover member 41 and will possess a thickness of only about 2 mils. In FIG. 3, two quantities of paste are utilized, but it is again understood that in the broadest aspects of this invention, only two substrates (11 and 13) may be utilized to form a successfully bonded final structure 10'.

Figure 4:
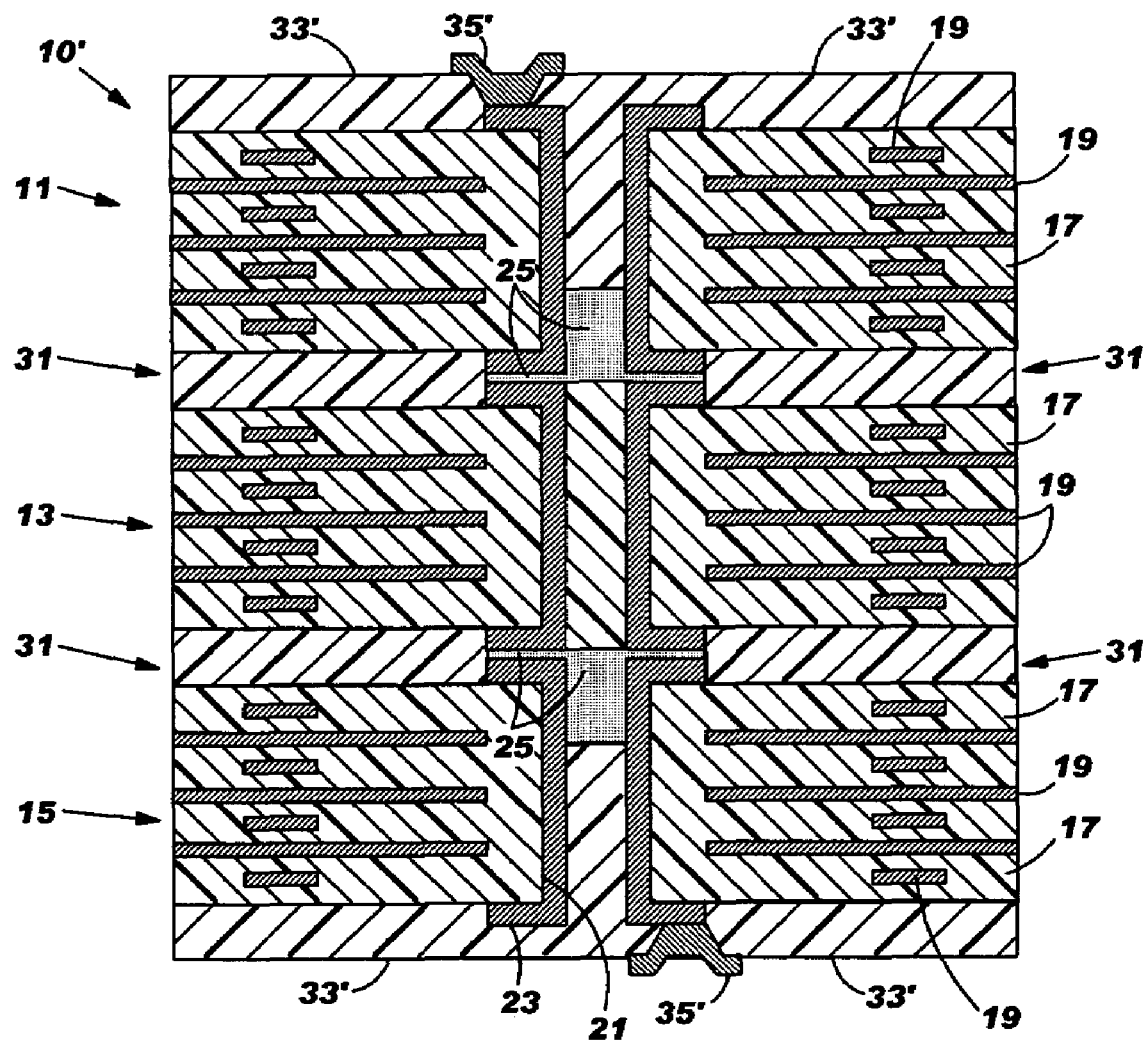
FIG. 4 is a side-elevational view of the assembly of FIG. 3 following bonding.

In FIG. 4, the exploded structure 10' in FIG. 3 is shown as being bonded, preferably using a lamination process as described above. Significantly, the respective quantities of paste 25 have extended outwardly from the cover member 41 to partially fill the opening in the respective opposing substrate. Of further significance, a portion of the conductive paste 25 remains positioned between the external surfaces of the outwardly projecting land portions of the respective layers 23 to even further enhance the electrical coupling between the respective substrates. As in the embodiment of FIG. 1, a dielectric 33', in addition to an external conductor 35', may also be added, including on opposite sides of the formed assembly 10'.

Thus there has been shown and defined a circuitized substrate assembly comprised of at least two circuitized substrates, each including an opening therein which are aligned such that these openings can be electrically coupled during the subsequent bonding process.

An assembly of the present invention provides significant wiring density increases over conventional printed circuit board constructions. This is primarily due to the fact that wiring PTHs no longer need to go through the entire assembly, but rather can stop on any given layer. Thus, wiring on the lower layers can be run unobstructed from any plated-thru-hole (PTH) blockages. The present invention also eliminates the drill and plate concerns of high aspect ratio thru holes that are common with conventional circuit boards.

The present invention provides a robust process and structure, while not requiring complete initial filling of all openings with paste prior to final joining, which would in turn require more exacting process tolerances to achieve high joining yield and reliable structures. For example, such fillings would require the thickness of the 2 conductive pads to be joined plus the thickness of the conductive adhesive to be roughly equal to the sticker sheet. If the sticker sheet is thicker, then there could be poor contact of the conductive joints. If the pads plus paste are thicker than the sticker sheet, then there could be voids in the sticker sheet, or the conductive paste could be squeezed laterally, to the extent of possibly shorting adjacent pads. For such requirements, tolerance requirements were less than 1 mil, while the sum of the tolerance capabilities was significantly higher than 1 mil. The present invention substantially overcomes these problems.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate assembly comprising: a first circuitized substrate including an opening therein; a second circuitized substrate bonded to said first circuitized substrate and including an opening therein aligned with said opening in said first circuitized substrate; an electrically conductive cover member substantially covering said opening in said second circuitized substrate on the surface of said second circuitized substrate facing said first circuitized substrate; a quantity of electrically conductive paste positioned on said cover member and only partly filling said opening in said first circuitized substrate; and a layer of dielectric material positioned on an external surface of said first circuitized substrate and extending within said opening of said first circuitized substrate.

2. The assembly of claim 1 wherein said first and second circuitized substrates each include at least one electrically conductive plane and at least one dielectric layer.

3. The assembly of claim 1 wherein each of said openings in said first and second circuitized substrates includes an electrically conductive material thereon, said electrically conductive paste being in electrical contact with said electrically conductive material in said opening in said first circuitized substrate.

4. The assembly of claim 3 wherein said electrically conductive material comprises a plated layer of metal.

5. The assembly of claim 1 further including an interim dielectric layer between said first and second circuitized substrates.

6. The assembly of claim 1 wherein said cover member comprises a metallic layer.

7. The assembly of claim 6 wherein said metallic layer is copper.

8. The assembly of claim 1 wherein said opening in said second circuitized substrate is filled with a dielectric material, said cover member being positioned on said dielectric material.

9. The assembly of claim 1 further including a third circuitized substrate also having an opening therein and bonded to said second circuitized substrate such that said opening in said third circuitized substrate is substantially aligned with said opening in said second circuitized substrate, said assembly further including a second cover member substantially covering said opening in said second circuitized substrate and a second quantity of electrically conductive paste positioned on said second cover member and only partly filling said opening in said third circuitized substrate.

* * * * *